(12) United States Patent
Nitta et al.

(10) Patent No.: US 7,329,903 B2
(45) Date of Patent: Feb. 12, 2008

(54) SEMICONDUCTOR LIGHT EMITTING ELEMENT HAVING THREE SIDE SURFACES INCLINED TO CONNECT THE TOP AND BOTTOM SURFACES OF THE TRANSPARENT SUBSTRATE

(75) Inventors: Koichi Nitta, Fukuoka (JP); Takafumi Nakamura, Fukuoka (JP); Kuniaki Konno, Kanagawa (JP); Yasuhiko Akaike, Kanagawa (JP); Yoshiki Endo, Chiba (JP); Katsufumi Kondo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/371,873

(22) Filed: Mar. 8, 2006

(65) Prior Publication Data

US 2006/0145171 A1 Jul. 6, 2006

Related U.S. Application Data

(62) Division of application No. 10/388,376, filed on Mar. 13, 2003, now Pat. No. 7,038,245.

(30) Foreign Application Priority Data

Mar. 14, 2002 (JP) ............................. 2002-070719
Mar. 7, 2003 (JP) ............................. 2003-062079

(51) Int. Cl.
*H01L 27/15* (2006.01)
*H01L 31/12* (2006.01)
*H01L 33/00* (2006.01)

(52) U.S. Cl. .................... 257/95; 257/98; 257/E31.095

(58) Field of Classification Search .................. 257/95, 257/98
See application file for complete search history.

(56) References Cited

U.S. PATENT DOCUMENTS 4,604,161 A 8/1986 Araghi (Continued)

FOREIGN PATENT DOCUMENTS

CN 1158017 8/1997

(Continued)

OTHER PUBLICATIONS

U.S. Appl. No. 10/863,269, filed Jun. 9, 2004, Nitta Koichi.

*Primary Examiner*—Anh D Mai
(74) *Attorney, Agent, or Firm*—Hogan & Hartson LLP

(57) ABSTRACT

For the purpose of enhancing the light extracting efficiency, improving the production yield and elongating the lifetime of a semiconductor light emitting element or a semiconductor light emitting device using the element, a semiconductor light emitting element comprises: a light emitting layer that emits light; and a substrate transparent to the light emitted from the light emitting layer. The substrate defines a top surface supporting the light emitting layer thereon; a bottom surface opposed to the top surface and side surfaces connecting the top surface and the bottom surface. Each of the side surfaces is composed of first side surface extending from the top surface toward the bottom surface, second side surface extending from the first side surface toward the bottom surface, and third side surface extending from the second side surface toward the bottom surface. The third side surfaces incline to diverge toward the top surface, and the second side surfaces incline to diverge more toward the top surface to extract part of the light from the light emitting layer externally. The first side surfaces are formed by cleavage along cleavable planes.

21 Claims, 11 Drawing Sheets

U.S. PATENT DOCUMENTS

| | | | |
|---|---|---|---|
| 5,187,547 A * | 2/1993 | Niina et al. | 257/77 |
| 5,349,211 A | 9/1994 | Kato | |
| 5,753,966 A | 5/1998 | Morita et al. | |
| 5,779,924 A | 7/1998 | Krames et al. | |
| 5,904,548 A | 5/1999 | Orcutt | |
| 6,323,063 B2 | 11/2001 | Krames et al. | |
| 6,395,572 B1 | 5/2002 | Tsutsui et al. | |
| 6,531,405 B1 | 3/2003 | Wegleiter et al. | |
| 6,576,932 B2 | 6/2003 | Khare et al. | |
| 6,730,939 B2 | 5/2004 | Eisert et al. | |
| 6,740,906 B2 | 5/2004 | Slater et al. | |
| 6,784,463 B2 * | 8/2004 | Camras et al. | 257/99 |
| 6,995,032 B2 * | 2/2006 | Bruhns et al. | 438/33 |
| 2002/0179910 A1 * | 12/2002 | Slater, Jr. | 257/77 |
| 2003/0218172 A1 | 11/2003 | Sugawara et al. | |
| 2004/0026700 A1 | 2/2004 | Akaike et al. | |
| 2005/0017258 A1 * | 1/2005 | Fehrer et al. | 257/98 |
| 2006/0124945 A1 * | 6/2006 | Baur et al. | 257/98 |

FOREIGN PATENT DOCUMENTS

| | | |
|---|---|---|
| CN | 1224533 | 7/1999 |
| CN | 1434984 | 8/2003 |
| JP | 02-010879 | 1/1990 |
| JP | 02-154482 | 6/1990 |
| JP | 10-341035 | 12/1998 |
| JP | 11-354837 | * 12/1999 |
| JP | 2000-299494 | 10/2000 |
| JP | 2001-057441 | 2/2001 |
| JP | 2001-144322 | 5/2001 |
| JP | 2001-291895 | 10/2001 |
| JP | 2003-523635 | 5/2003 |

* cited by examiner

SEMICONDUCTOR LIGHT EMITTING ELEMENT HAVING THREE SIDE SURFACES INCLINED TO CONNECT THE TOP AND BOTTOM SURFACES OF THE TRANSPARENT SUBSTRATE

CROSS-REFERENCE TO RELATED APPLICATIONS

This is a divisional of application Ser. No. 10/388,376 filed Mar. 13, 2003, now U.S. Pat. No. 7,038,245, which application is incorporated by reference. This application also claims benefit of priority under 35 U.S.C. § 119 from Japanese Patent Application No. 2002-070719, filed Mar. 14, 2002, and from Japanese Patent Application No. 2003-062079, filed Mar. 7, 2003. The entire contents of both priority applications are incorporated by reference.

BACKGROUND OF THE INVENTION

1. Field of the Invention

The present invention relates to a semiconductor light emitting element and a semiconductor light emitting device.

2. Related Background Art

Semiconductor light emitting elements are used in display boards, back-lighting of liquid crystals, etc. as light sources of low power consumption, high efficiency and high reliability to substitute for lamps. Especially, InGaAlP compound semiconductor materials are direct transition type materials and capable of emitting bright light in the region from red to green. Therefore, InGaAlP compound semiconductor light emitting elements are actually used in red stop lamps of cars, red and yellow lamps of traffic lights, and so on, as relatively luminous elements. In such a semiconductor light emitting element, emission is attained by recombination of holes and electrons when a current is injected in the active layer inside the light emitting layer. Part of the light generated in the active layer is taken out externally from the surface of the semiconductor element. The semiconductor light emitting element is usually mounted on a lead frame including a reflection board, and sealed with a mold of epoxy resin having a lens-like configuration. Emission property is controlled by reflecting light from the semiconductor light emitting element with the reflection board and converging the reflected light with a lens.

Although InGaAlP compound semiconductor materials ensure high-luminance emission, they are formed on opaque GaAs substrates. Therefore, if GaAs substrates are maintained, absorption of light by GaAs substrates will occur. To cope with this problem, a method for obtaining a relatively high-luminance semiconductor light emitting element has been developed recently, which first forms InGaAlP compound semiconductor materials on an opaque GaAs substrate, thereafter bonds a transparent GaP substrate and instead removing the opaque GaAs substrate. The term "transparent" is used here to mean transparency to light emitted from the light emitting element.

Even by bonding a transparent substrate, this method could not successfully make the best use of the excellent properties of InGaAlP compound semiconductor materials, and luminance of the element is still insufficient. Its reason lies in that the light extracting efficiency is low. More specifically, light generated from an InGaAlP active layer inside a semiconductor element is radiated in all directions over 360°. However because of a difference in refractive index between the semiconductor crystal and epoxy resin sealing it, part of the light is reflected by the semiconductor interface and cannot extracted externally of the semiconductor crystal. Assuming that the refractive index of the semiconductor crystal is 3.3 and that of the epoxy is 1.5, the critical angle is $\theta c = \sin^{-1}(1.5/3.3) = 27°$ according to the Snell's law, and rays of light that impinge the interface between the semiconductor and the resin at angles larger than 27° undergo total reflection, and it is impossible to extract this light from inside the semiconductor crystal. Usually, semiconductor light emitting elements are cubes (hexahedrons), and if light can be extracted ideally from all surfaces, approximately 28% of light should be extracted. Actually, however, extractable quantity of light is less than 28% because: two kinds of electrodes of the n-type and the p-type are formed on surfaces of the semiconductor crystal; the n-type or p-type electrode is bonded to the reflection board with an adhesive; and part of light impinging the electrode surfaces is absorbed by the electrode alloy layer.

As a structure overcoming this problem and enhancing the light extraction efficiency, a method using a transparent substrate and appropriately shaping the transparent electrode is currently under researches. This method is disclosed in, for example, Japanese Patent Laid-Open Publication No. hei 10-341035. FIG. 16 shows this method. On a first surface 301 of a transparent p-type GaP substrate 300, as illustrated, a light emitting layer 314 is formed. The light emitting layer 314 has a structure including a p-type semiconductor layer, active layer and n-type semiconductor layer sequentially stacked on the first surface 301 of the p-type GaP substrate 300. The light emitting layer 314 is supplied with a current from the p-side electrode 309 and the n-side electrode 310. In response to injection of the current, the active layer of the light emitting layer 314 emits light, and this light is extracted from the second surface 302 of the substrate 300. In order to increase the total quantity of extracted light, the semiconductor light emitting element shown in FIG. 16 is so shaped that orientation of side surfaces 303 of the transparent substrate 300 are offset from the direction vertical to the light emitting layer 314. In this configuration of the element, the shaped side surfaces 303 of the transparent substrate 300 reflects the light emitted from the light emitting layer 314 toward the second surface 302. Therefore, this method certainly enables extraction of more light from the second surface 302. Additionally, from the edge surface 303, it is possible to extract part of light reflected by the second surface 302, and thereby increases the quantity of entire extracted light. Furthermore, since the shaped side surfaces 303 ensure extraction of light generated inside without suffering multiple reflections by the crystal interface, absorption by the active layer of the light emitting layer 314 or absorption by ohmic contact portions decreases. As such, the embodiment shown in FIG. 16 enhances the light extraction efficiency by using the second surface 302 of the substrate 300 as light extracting surface and adequately shaping the substrate 300.

However, the semiconductor light emitting element of FIG. 16 and a semiconductor light emitting device using it involve some problems such as insufficient production yield and short lifetime irrespectively of their high efficiency of extraction of light.

More specifically, since the element of FIG. 16 uses the second surface 302 as the light extracting surface, the pn junction in the light emitting layer 314 is close to the lower mount surface 304 as illustrated. Therefore, when the mount surface 304 of the element is mounted on a lead frame with an electrically conductive mount agent (adhesive), edge surfaces 305 of the on junction in the light emitting layer 314 are short-circuited, and this causes the problem of decreasing the production yield. If the mount agent is reduced not to creep on the edge surfaces 305 of the light emitting layer 314 to eliminate that problem, then the bonding force decreases, and this invites another problem that the mount surface 304 of the light emitting element easily separates from the lead frame during long-time electrical excitation and it reduced in lifetime.

Additionally, the element of FIG. 16 needs dicing for adequately shaping the substrate 300. In the dicing process, however, the dicing blade may produce damage layers (crystal defects) on the side surfaces 303 and inside the substrate 300. Thus, during long-time electrical excitation, crystal defects grow from the damage layers, the light emitting layer 314 becomes liable to break, and the lifetime is shortened. Additionally, if the semiconductor light emitting element including such damage layers is sealed with epoxy resin, crystal defects grow from the shaped side surfaces 303 of the substrate 300 having such damage layers to the light emitting layer 314 due to the resin stress during electrical excitation, and may invite deterioration of the optical output. Here again, the lifetime will be shortened. Taking this problem into account, encapsulation, which seals the light emitting element with a soft gel resin such as silicone, is employed. However, since the outside of the encapsulation is sealed by a hard resin such as epoxy, interfacial separation, which is separation of silicone and epoxy along their interface, will occur, and the optical output will decrease during electrical excitation. Here again the lifetime will be shortened. Therefore, it has been believed that the lifetime is inevitably shortened in case the substrate 300 is machined.

As such, it has generally been believed that the semiconductor light emitting element including a substrate adequately shaped to enhance the light extraction efficiency is inevitably subject to a decrease of the production yield and a reduction of the lifetime, although the light extraction efficiency is certainly enhanced.

SUMMARY OF THE INVENTION

The invention is based on recognition of the problems reviewed above, and its object is to provide a semiconductor light emitting element and a semiconductor light emitting device that are enhanced in light extracting efficiency, improved in production yield and having a longer lifetime.

According to embodiments of the present invention, there is provided a semiconductor light emitting element comprising:
  a light emitting layer for emitting light; and
  a substrate transparent to the light emitted from the light emitting layer, and having:
    a top surface on which the light emitting layer is formed;
    a bottom surface opposed to the top surface; and
    side surfaces connecting the top surface and the bottom surface,
    wherein each of the side surfaces is composed of first side surface extending from the top surface toward the bottom surface, second side surface extending from the first side surface toward the bottom surface, and third side surface extending from the second side surface toward the bottom surface,
    wherein the third side surfaces incline to diverge toward the top surface, and the second side surfaces incline to diverge more toward the top surface to extract part of the light from the light emitting layer externally, and
    wherein the first side surfaces are cleavable planes.

According to embodiments of the present invention, there is further provided a semiconductor light emitting element comprising:
  a light emitting layer for emitting light; and
  a substrate transparent to the light emitted from the light emitting layer, and having:
    a top surface on which the light emitting layer is formed;
    a bottom surface opposed to the top surface; and
    side surfaces connecting the top surface and the bottom surface,
    wherein each of the side surfaces is composed of first side surface extending from the top surface toward the bottom surface, second side surface extending from the first side surface toward the bottom surface, and third side surface extending from the second side surface toward the bottom surface,
    wherein the third side surfaces incline to diverge toward the top surface, and the second side surfaces incline to diverge more toward the top surface to extract part of the light from the light emitting layer externally, and
    wherein the first side surfaces incline to converge toward the top surface of the substrate from the direction vertical to the top surface by an angle equal to or larger than 16° and equal to or smaller than 60°.

According to embodiments of the present invention, there is further provided a semiconductor light emitting device comprising:
  a semiconductor light emitting element including;
  a light emitting layer for emitting light; and
  a substrate transparent to the light from the light emitting layer and having:
    a top surface on which the light emitting layer is formed;
    a bottom surface opposed to the top surface; and
    side surfaces connecting the top surface and the bottom surface,
    wherein each of the side surfaces is composed of first side surface extending from the top surface toward the bottom surface, second side surface extending from the first side surface toward the bottom surface, and third side surface extending from the second side surface toward the bottom surface,
    wherein the third side surfaces incline to diverge toward the top surface, and the second side surfaces incline to diverge more toward the top surface to extract part of the light from the light emitting layer externally, and
    wherein the first side surfaces are cleavable planes;
  a lead frame; and
  a mounting agent which is electrically conductive and mounts the bottom surface of the substrate of the semiconductor light emitting element to the lead frame.

According to embodiments of the present invention, there is further provided a semiconductor light emitting device comprising:
  a semiconductor light emitting element including;
  a light emitting layer for emitting light; and
  a substrate transparent to the light from the light emitting layer and having:
    a top surface on which the light emitting layer is formed;
    a bottom surface opposed to the top surface; and
    side surfaces connecting the top surface and the bottom surface,
    wherein each of the side surfaces is composed of first side surface extending from the top surface toward the bottom surface, second side surface extending from the first side surface toward the bottom surface, and third side surface extending from the second side surface toward the bottom surface, wherein the third side surfaces incline to diverge toward the top surface, and the second side surfaces incline to diverge more toward the top surface to extract part of the light from the light emitting layer externally, and wherein the first side surfaces incline to converge toward the top surface of the substrate from the direction vertical to the top surface by an angle equal to or larger than 16° and equal to or smaller than 60°;

a lead frame; and a mounting agent which is electrically conductive and mounts the bottom surface of the substrate of the semiconductor light emitting element to the lead frame.

DETAILED DESCRIPTION OF THE INVENTION

Figure 1:
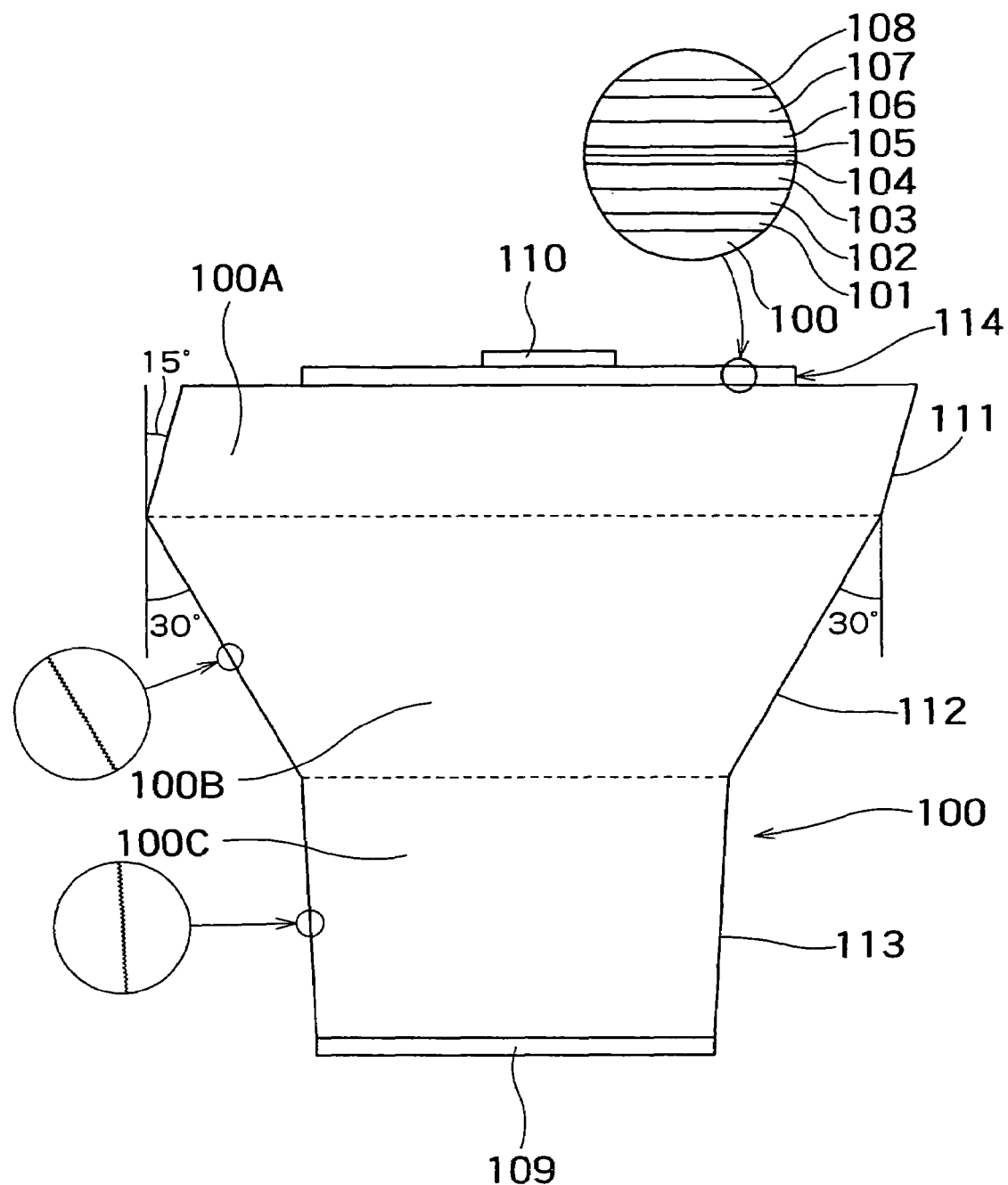
FIG. 1 is a schematic cross-sectional view showing a semiconductor light emitting element according to the first embodiment of the invention.

An embodiment of the present invention will now be explained below with reference to the drawings. As apparent from FIGS. 1 and 8, one of the features of this embodiment lies in using a GaP substrate 100 transparent to light from the light emitting layer 114 and forming side surfaces of the transparent substrate 100 to include three side surfaces 111, 112, 113, respectively. The third side surfaces 113 slightly incline to diverge toward the top surface, and contribute to facilitating the mounting of the element 1 and a lead frame 2 by a mount agent 6 and improving the production yield by preventing the mount agent 6 from creeping up onto the second side surfaces 112. The second side surfaces 112 incline by 300 to diverge toward the top surface, and contribute to enhancing the light extracting efficiency by guiding part of light from the light emitting layer 114 to the exterior. The first side surfaces 111 are obtained by cleavage along a cleavable plane, and include very few crystal defects. Therefore, they contribute to preventing crystal defects produced in the second side surfaces 112 from adversely affecting the light emitting layer 114, thereby minimizing deterioration of the light emitting layer 114 and elongating the lifetime of the element. The third side surfaces 113 and the second side surfaces 112 have formed a plurality of depressions and protrusions (ups and downs) to enhance the aforementioned effects. The first and second embodiment will now be explained below.

FIRST EMBODIMENT

FIG. 1 is a schematic cross-sectional view showing a semiconductor light emitting element according to the first embodiment of the invention. The semiconductor light emitting element has a structure including the GaP substrate 100 and the light emitting layer 114 formed on a top surface of the substrate 100 and made of InGaAlP compound materials. The GaP substrate 100 is off-axis (100) GaP substrate and the off-axis angle of the substrate is 15°. In turn, the GaP substrate 100 inclines by 15° in the [011] direction from the (100) orientation. The light emitting layer 114 has a structure made by sequentially depositing, on the top surface of the p-type GaP substrate 100, an adhesive distortion relaxing layer 101 made of InGaP doped with a p-type impurity, clad layer 102 made of InGaAlP added with a p-type impurity, optical guide layer 103 made of InGaAlP added with a p-type impurity, quantum well layer 104 made of InGaAlP added with a p-type impurity, barrier layer 105 made of InGaAlP added with a p-type impurity, clad layer 106 made of InGaAlP added with an n-type impurity, current diffusion layer 107 made of InGaAlP added with an n-type impurity, and contact layer 108 made of GaAs added with an n-type impurity. Formed on a bottom surface of the p-type GaP substrate 100 is a p-side electrode 109 made of a metal containing at least Au and Zn. Formed on the n-type GaAs contact layer 108 is an n-side electrode 110 made of a metal containing at least Au and Ge. When a plus voltage is applied to the p-side electrode 109 and a minus voltage to the n-side electrode 110, light is generated from the quantum well layer 104. In this case, the GaP substrate 100 is transparent to light from the quantum well layer 104, and light is extracted from the second side surfaces 112 of the GaP substrate 100 as well.

One of the features of the semiconductor light emitting element of FIG. 1 is that side surfaces of the transparent substrate 100 include three side surfaces 111, 112, 113, respectively. The transparent substrate 100 is made of GaP added with Zn and Mg as p-type impurities, and its thickness is 250 μm. The transparent substrate 100 includes: a top surface on which the light emitting layer 114 is formed; bottom surface opposed to the top surface; first portion 110 including the top surface; second portion 100B formed adjacent to the first portion 100A; and third portion 100C adjacent to the second portion 100B and including the bottom surface. The third portion 100C of the transparent substrate 100 defines first side surfaces 113 continuous from the bottom surface and inclined to diverge toward the top surface. Size of the bottom surface is 150×150 μm². Its height is 100 μm. The third side surfaces 113 have a plurality of ups and downs that are 1~2 μm high. The second portion 100B defines second side surfaces 112 that further diverge toward the top surface with inclination of 30° relative to the direction vertical to the top surface to extract part of light from the light emitting layer 114 externally. The second portion is 100 μm high. The first portion 100A has first side surfaces 111 obtained by cleavage along cleaving planes. The right left first side surfaces are parallel to each other as illustrated, and the left first side surface 111 inclines to converge toward the top surface. As set forth before, the GaP substrate 100 is 15° off-axis substrate. Therefore, the angle of inclination of the first side surfaces 11 as cleaved surfaces is 15°. Since the first side surfaces 111 are cleaved surfaces, they define very smooth surfaces, and include very few crystal defects as compared with the other side surfaces 113, 112. Height of the first portion 100A is 50 μm.

The transparent substrate 100 may be described as follows as well. That is, the substrate 100 has the top surface on which the light emitting layer 114 is formed, bottom surface opposed to the top surface, and side surfaces 111~113 connecting the top and bottom surfaces. Each of the side surfaces 111~113 is composed of the first side surface 111 extending from the top surface toward the bottom surface, the second side surface 112 extending from the first side surface 112 toward the bottom surface, and the third side surface 113 extending from the second side surface toward the bottom surface. The third side surfaces 113 incline to diverge toward the top surface. The second side surfaces 112 incline to diverge more toward the top surface to extract part of light from the light emitting layer 114 externally. The first side surfaces 111 are formed by cleavage along cleavable planes. This is another way of depiction of the substrate 100.

Figure 5:
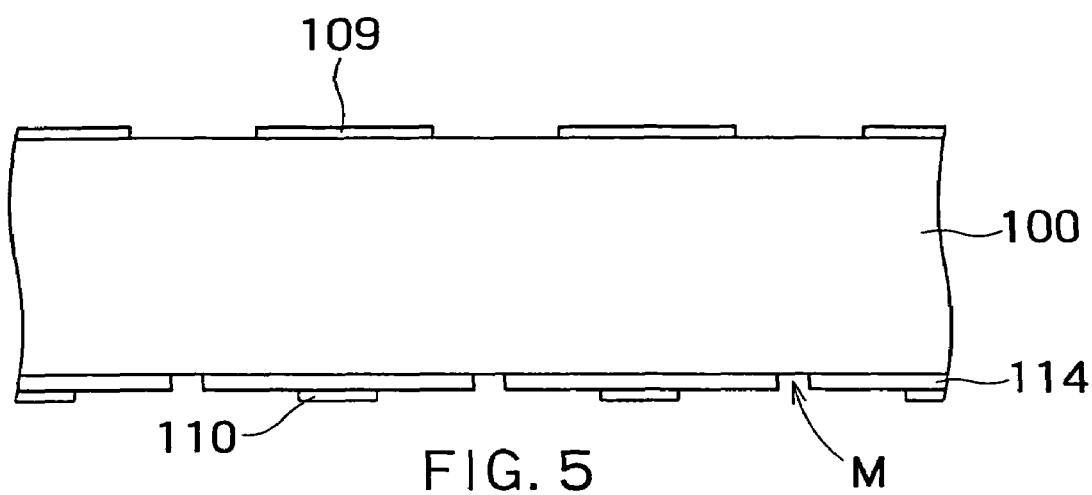
FIG. 5 is a schematic cross-sectional view showing a method of manufacturing the semiconductor light emitting element according to the fist embodiment of the invention; which follows FIG. 4.
Figure 6:
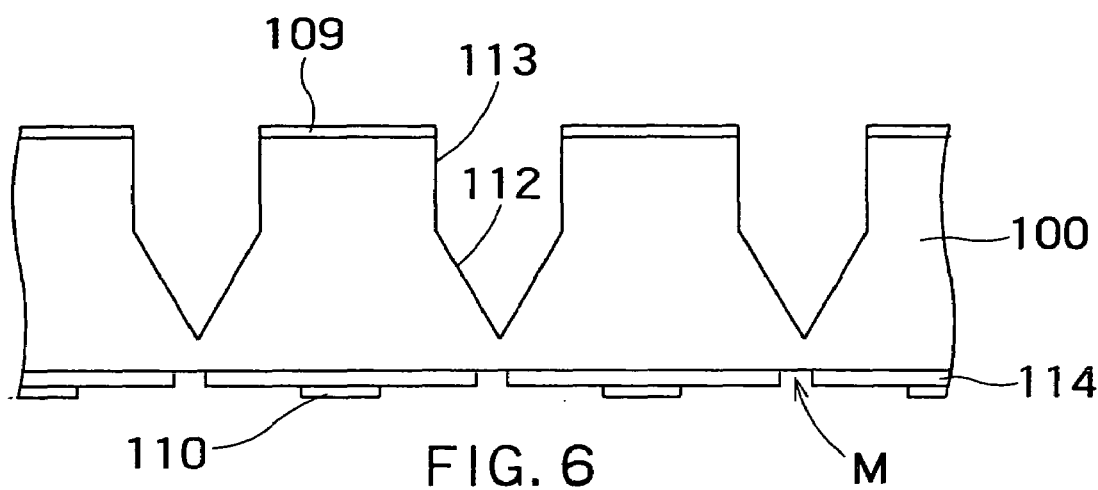
FIG. 6 is a schematic cross-sectional view showing a method of manufacturing the semiconductor light emitting element according to the fist embodiment of the invention; which follows FIG. 5.
Figure 7:
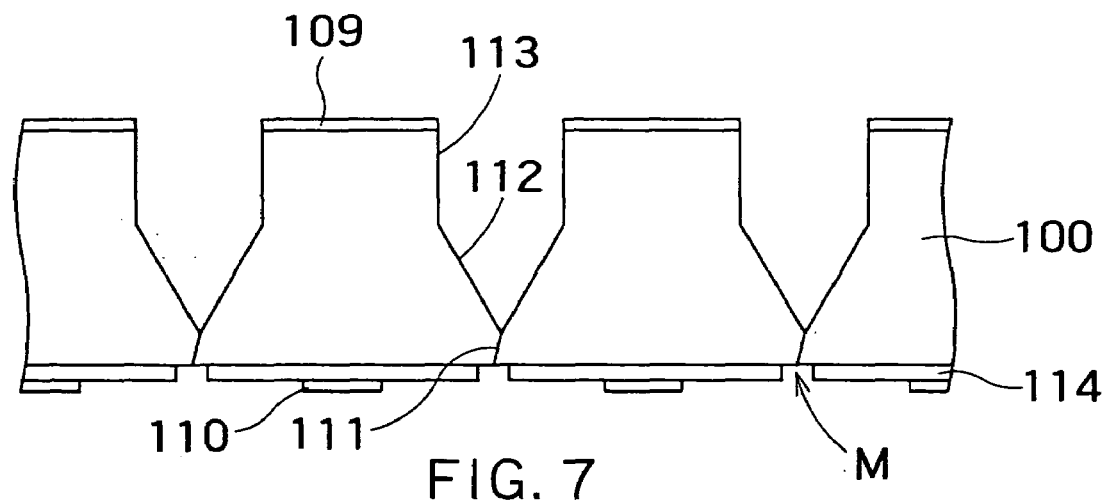
FIG. 7 is a schematic cross-sectional view showing a method of manufacturing the semiconductor light emitting element according to the fist embodiment of the invention; which follows FIG. 6.

Next explained is a method of manufacturing the semiconductor light emitting element according to the first embodiment with reference to FIGS. 2 through 7. One of features of the manufacturing method according to the instant embodiment lies in forming the first side surfaces 111 by cleave as shown in FIG. 7. In this manner, the first side surfaces 111 can be formed with very few crystalline defects.

Figure 2:
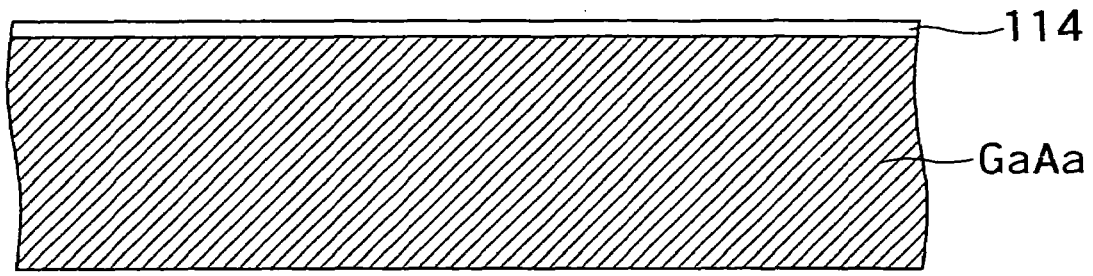
FIG. 2 is a schematic cross-sectional view showing a method of manufacturing the semiconductor light emitting element according to the fist embodiment of the invention.

(1) First as shown in FIG. 2, the light emitting layer 114 is formed on a GaAs substrate by MOCVD. Since the light emitting layer 114 is made of InGaAlP compound materials, GaAs in lattice matching therewith is used as the substrate. The GaAs substrate, however, is opaque to light from the light emitting layer 114. The GaAs substrate inclines by 15° in the [011] direction from the (100) orientation. It is known that a substrate having this inclination (off-axis angle) enhances the emission luminance of the light emitting layer 114. In order to ensure this effect, the off-axis angle is preferably controlled to be equal to or larger than 5° and equal to or smaller than 30° (hereinafter expressed as the range from 5° to 30°).

Figure 3:
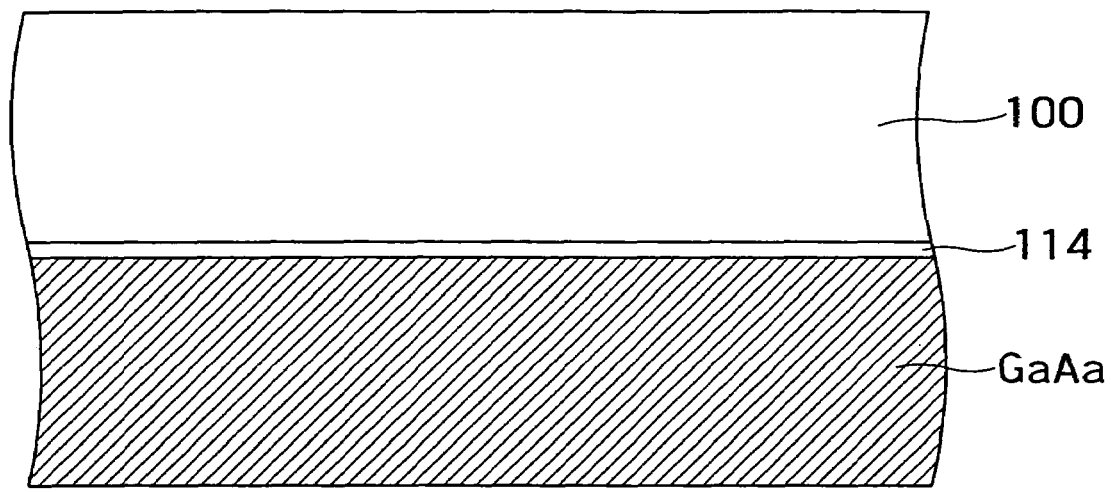
FIG. 3 is a schematic cross-sectional view showing a method of manufacturing the semiconductor light emitting element according to the fist embodiment of the invention, which follows FIG. 2.

(2) Next as shown in FIG. 3, the transparent GaP substrate 100 is bonded to the light emitting layer 114.

Figure 4:
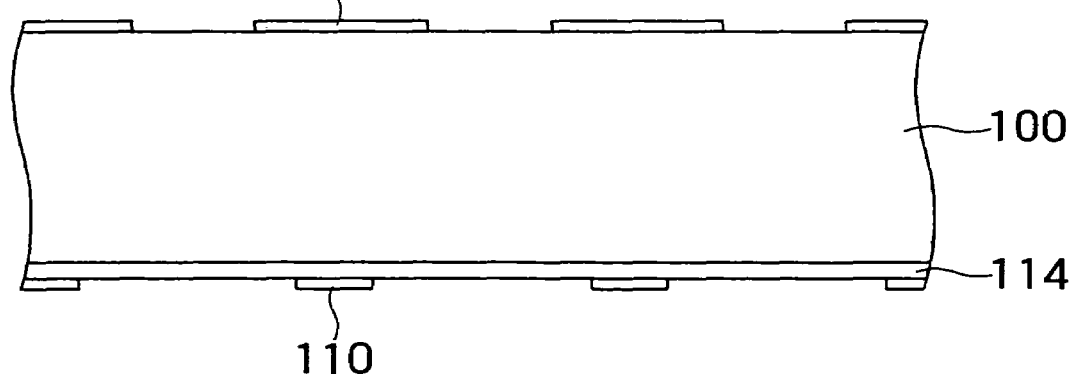
FIG. 4 is a schematic cross-sectional view showing a method of manufacturing the semiconductor light emitting element according to the fist embodiment of the invention; which follows FIG. 3.

(3) Next as shown in FIG. 4, the opaque GaAs substrate is removed, and electrodes 109, 110 are formed.

(4) Next as shown in FIG. 5, selective portions M of the light emitting layer are removed by etching. This etching facilitates cleavage explained later.

(5) Next as shown in FIG. 6, using a dicing blade having a narrowed tip, the third side surfaces 113 and the second side surfaces 112 are formed. The angle of inclination of the second side surfaces 112 can be changed by changing inclination of the tip of the dicing blade. After that, ups and downs are formed in and on the third and second side surfaces 113, 112. More specifically, the ups and downs are made by immersing the substrate in a mixed solution containing hydrogen peroxide, water and hydrochloric acid and controlled in temperature from −50° C. to the room temperature for several minutes, and immersing in hydrochloric acid adjusted in temperature from the room temperature to 100° C. for several minutes. If the temperature for immersion is high, the process time can be shortened. However, morphology of ups and downs is the same. In case the ups and downs are formed by gas etching using a gas containing chlorine gas, sediments remain on the surface after etching, and their removal with a sulfuric acid-based etchant or phosphoric acid-based etchant. Morphology of ups and downs is the same as that formed by etching with a solution. The electrodes 109, 110 are covered with a resist or an oxide film in the etching process.

(6) Next as shown in FIG. 7, the first side surfaces 111 are formed by cleavage. More specifically, the first side surfaces 111 are formed by scribing the selective portions M, where the light emitting layer 114 of InGaAlP materials has been removed, with a cutter having diamond on its tip in the cleavable direction, and splitting the substrate under application of weight. Thus the semiconductor light emitting element of FIG. 1 is completed.

In the semiconductor light emitting element of FIG. 1 obtained by the above-explained manufacturing method and a semiconductor light emitting device using the element, since three side surfaces 111, 112, 113 compose each side surface of the transparent substrate 100, the light extraction efficiency is enhanced, the production yield is high, and the lifetime is elongated. The device is explained below with reference to FIG. 8.

Figure 8:
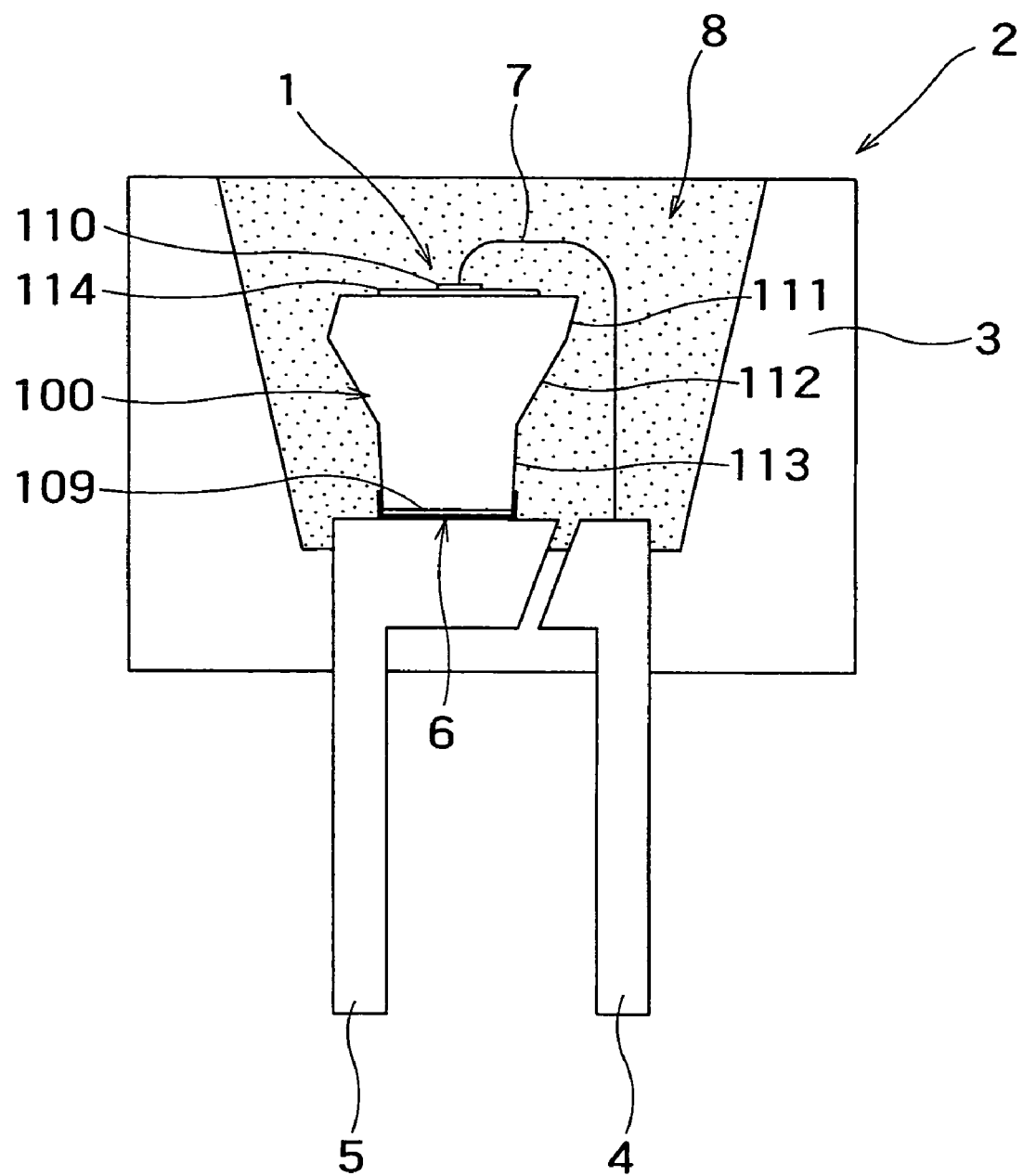
FIG. 8 is a schematic cross-sectional view showing a semiconductor light emitting device according to the first embodiment of the invention.

FIG. 8 shows a semiconductor light emitting device using the semiconductor light emitting element of FIG. 1. The transparent substrate 100 of the semiconductor light emitting element 1 is mounted on a lead frame 2 with Ag paste 6 used as the amount agent (adhesive). The lead frame 2 is made of a metal plated with nickel, for example, and includes a p-side lead 5, n-side lead 4 and reflection board 3. Electrically connected to the p-side lead 5 is the p-side electrode 109 by Ag paste 6. Electrically connected to the n-side lead 4 is the n-side electrode 110 by a wire 7. The semiconductor light emitting element 1 including the n-side electrode 110 and the p-side electrode 109 is sealed by sealing resin 8. A lead integrally including the p-side lead 5 and the reflection board 3 altogether may be used as well.

The semiconductor light emitting device of FIG. 8 ensures high adhesive force by forming the third side surfaces 113 as high as 100 μm and applying the Ag paste 6 to the side surfaces 113 as well in addition to the bottom surface of the substrate 100. Additionally, since the third side surfaces 113 slightly incline to diverge toward the top surface, they prevent the Ag paste 6 from creeping up with its surface tension, which will otherwise occur when the Ag paste is heated and hardened. Therefore, the device can prevent the opaque Ag paste from covering the second side surfaces 112 and thereby prevents reduction of the quantity of light extracted from the second side surfaces 112. As a result, the production yield is improved. Moreover, since the third side surfaces 113 have a plurality of ups and downs that are 1~2 μm high, they prevent creepage of the Ag paste 6 more effectively and further increase the production yield.

Furthermore, the semiconductor light emitting device of FIG. 8 uses a transparent material as the substrate 100, and incline the second side surfaces 112 by 30°, light can be extracted from the second side surfaces 112. Therefore, the device can be enhanced in light extracting efficiency. Further, since the second side surfaces have a plurality of ups and downs that are 1~2 μm high, they are increased in surface areas and further enhance the light extracting efficiency. Additionally, the increased surface areas contribute to increasing the adhesive force between the sealing resin 8 and the semiconductor light emitting element 1 and to preventing separation of the light emitting element 1 from the lead frame 2. In contrast, in a device not having such ups and downs, resin stress of the sealing resin 8 worked on the second side surfaces 112 toward lifting the light emitting element 1 from the bottom side to the top side, the light emitting element 1 is liable to separate from the lead frame 2 during electrical excitation, and the lifetime of the device might be shortened.

Additionally, the device shown in FIG. 8 having cleaved surfaces as the first side surfaces 111 can prevent that crystal defects of the second side surfaces 112 inevitably produced in the dicing process adversely affect the light emitting layer 114. As shown in FIG. 6 already explained, the third side surfaces 113 and the second side surfaces 112 are formed by dicing. In the dicing process, it is inevitable that crystal defects are produced in the third side surfaces 113 and the second side surfaces 112 and that damage layers are produced. In the device of FIG. 8, however, the first side surfaces are cleaved surfaces, and there are very few crystal defects near the cleaved surfaces 111. Therefore, the first side surfaces 111 prevent growth of crystal defects to the light emitting layer 114. As a result, the device is reduced in crystal defects of the light emitting layer 114, reduced the light absorption by the crystal defects and enhanced in optical output from the light emitting layer. Additionally, since the left first side surface 111 as illustrated inclines toward narrowing the top surface, it prevents separation of the light emitting layer 1 by stress from the sealing resin 2. As already explained, the second side surfaces 112 of the light emitting element 1 suffers a force from the resin 2, which tends to lift the light emitting element 1 from the bottom surface toward the top surface. In the device of FIG. 8, however, since the left one of the first side surfaces 111 inclines toward narrowing the top surface, the resin stress working on the light emitting element 1 is distributed, and separation of the light emitting element 1 is reduced. Thereby, the lifetime of the device is elongated.

Additionally, in the semiconductor light emitting device of FIG. 8, since the surface area of the light emitting layer 114 is smaller than the surface area of the top surface of the substrate. 100, crystal defects are unlikely to be produced in the light emitting layer 114 when the first side surfaces 111 are formed. Therefore, deterioration by crystal defects of the light emitting layer 114 is less likely to occur, and the lifetime becomes even longer. Especially when the surface area of the light emitting layer 114 is approximately 65~85% of the top surface area of the substrate 100, it is possible to reduce crystal defects while increasing the surface area of the light emitting layer 114 and to realize a light emitting device that is enhanced in luminance and reliability.

As such, since the semiconductor light emitting device of FIG. 8 using the semiconductor light emitting element of FIG. 1 have three side surfaces 111, 112, 113 composing each side surface of the transparent substrate 100, it is enhanced in light extracting efficiency and production yield, and elongated in lifetime.

Although the p-type GaP substrate 100 in the semiconductor light emitting element of FIG. 1 has been explained as being 250 μm thick. However, it may be changed in the range from 150 μm to 300 μm. If it is thicker than 300 μm, light generated in the quantum well layer 104 of the light emitting layer 114 is absorbed by the p-type impurity of the GaP substrate 100, and quantity of light extracted externally is reduced. Further, in case the element is used in a traffic lamp or tail lamp of a car, for example, a large current as much as several amp. is required as the drive current of the light emitting element. Therefore, if the substrate is thicker than 300 μm, heat generation by the element resistance because of the thickness of the substrate 100 increases, and the sealing resin 2 suffers thermal deterioration by heat generation of the light emitting element 1. Thus the thickness of the substrate is preferably equal to or thinner than 300 μm. In contrast, if the thickness of the GaP substrate 100 is equal to or thinner than 150 μm, then the electrodes 110, 109 formed on the top and bottom surfaces of the light emitting element interrupt the light emitted from the quantum well layer 104, and the light extracting efficiency degrades. Additionally, an electrode alloy layer formed to realize an ohmic property of the electrode absorbs light, and reduces the quantity of light extracted externally. Therefore, thickness of the substrate is preferably in the range from 150 μm to 300 μm.

The third portion 100C may be sized from 100×100 μm² to 200×200 μm² in bottom surface, and from 50 μm to 100 μm in height. As already explained, the substrate 100 is bonded with its bottom surface and the third side surfaces 113 too the lead frame 2 by the Ag paste 6. A reliability test demonstrated that the third portion 100C having a height in the range from 50 μm to 100 μm could maintain an acceptable bonding force. Additionally, it is confirmed by an environmental test that the bottom surface size from 100× 100 μm² to 200×200 μm² could ensure a sufficient bonding force of the amount. The angle of inclination of the third side surfaces 113 is smaller than the angle of inclination of the second side surfaces 112, and smaller than 20°.

The second side surfaces 112 may incline by 20° to 40°, and the length of the inclined portion may be from 60 μm to 200 μm. In this range of inclination, high efficiency of extracting light from the second side surfaces 112 is ensured. However, from the viewpoints of easier fabrication of the element, convenience for its assembly and lower cost, the inclined portion preferably has a length from 100 μm to 150 μm, and an angle of inclination from 25° to 35°.

The first side surfaces 111 may have a length of the inclined portion from 40 μm to 80 μm. In this case, the first side surfaces 111 effectively prevent growth of crystal defects from the second side surfaces 112 to the light emitting layer 114. The angle of inclination may be from 5° to 30° in accord with the off-axis angle the substrate 100. As already explained, the substrate 100 having an off-axis angle from 5° to 30° enhances the emission efficiency. Further, the angle of inclination may be approximately 0°, attaching importance to readiness of the manufacturing method similarly to the second embodiment (FIG. 9) explained later.

The light emitting layer 114 in the semiconductor light emitting element shown in FIG. 1 may have any structure provided they emit light that can pass through the GaP substrate 199. A specific example of the light emitting layer 114 shown in FIG. 1 will be explained below.

First explanation is directed to the p-type InGaP adhesive layer 101. The adhesive layer 101 made of InGaP doped with Zn or Mg as p-type impurity has a thickness from 1 nm to 1 µm, and impurity is doped by $1E17/cm^3$ to $1E21/cm^3$. As shown in FIG. 2, the adhesive layer functions to reduce crystal distortion occurring upon bonding the light emitting layer formed on the GaAs substrate to the GaP substrate 100. Semiconductor materials containing In, in particular, are characterized in being soft and delaying growth of crystal defects in the direction vertical to the plane thereof. Thus, the adhesive layer diminishes crystal distortion by the lattice mismatch and thermal distortion by the thermal expansion mismatch that occur upon bonding the substrate 100 to the light emitting layer 114. Therefore, growth of crystal distortion to the light emitting layer 114 is prevented, and the light emitting layer 114 does not deteriorate. Temperature for bonding is from 400° C. to 800° C. However, voltage drop at the bonding interface increases at lower temperatures. Therefore, the temperature is preferably equal to or higher than 700°. Additionally, as the material of the adhesive layer 101, InGaP not containing Al is optimum, since hard Al degrades the advantage of soft In. Further, since this layer functions as an absorption layer, depending upon the wavelength from the well layer 104, if the band gap of the well layer 104 is larger than the band gap of the adhesive layer 101, then the thickness of the adhesive layer 101 is preferably not larger than tens of nanometer. The adhesive layer 101 need not be so good in crystallographic property, but a property permitting a current to flow is sufficient for it.

Next explained is the p-type InGaAlP clad layer 102. The clad layer 102 made of the InGaAlP material doped with Mg or Zn as p-type impurity and exhibiting p-type conductivity has a thickness from 0.1 µm to 2 µm, and the quantity of doped impurity is from $1E17/cm^3$ to $1E20/cm^3$. The clad layer 102 has a band gap wider than the band gap of the quantum well layer 104 that is the active layer, and has the property of confining electrons and holes into the active layer (104 and 105). Since Zn or Mg used as p-type impurity suffer thermal diffusion when heated for bonding the substrate, the quantity of doped impurity is preferably limited not to exceed $5E19/cm^3$.

Next explained is the p-type InGaAlP optical guide layer 103. The optical guide layer 103 made of InGaAlP doped with Mg or Zn as p-type impurity and exhibiting p-type conductivity has a thickness from 0.1 µm to 1 µm, and the quantity of the doped impurity is $1E17/cm^3$ to $1E21/cm^3$. The material of the optical guide layer 103 has an intermediate band gap between that of the clad layer 102 and that of the quantum well layer 104 as the active layer. Light generated in the middle part of the quantum well layer 104 is confined in the quantum well layer 104. But, in the edge part of the quantum well layer 104, re-absorption of emitted light may occur. So, by providing the optical guide layer 103 having a small difference in refractive index, the light confined in the quantum well layer 104 can be extracted through the p-type clad layer 102 in the direction toward the p-type GaP substrate 100. Therefore, quantity of light traveling toward the GaP substrate 100 increases, and a large quantity of light can be extracted from the shaped GAP substrate 100. Especially in the quantum well structure sandwiched by p-type and n-type clad layers 102, 106, the optical guide layer 103 having an intermediate refractive index between those of the clad layers 102, 103 and that of the quantum well layer 104 is greatly effective for reducing re-absorption of light propagating in the active layer 104 toward its edges. Therefore, by adding an n-type optical guide layer to this embodiment, the quantity of extracted light increases more. The optical guide layer 103 preferably has a thickness equal to or larger than 500 nm to prevent impurity from diffusing from the p-type clad layer 102 to the quantum well layer 104 in the heating process for bonding the GaP substrate 100.

Next explained is the p-type InGaAlP quantum well layer 104. The quantum well layer 104 made of InGaAlP doped with Mg or Zn as p-type impurity and exhibiting p-type conductivity has a thickness from 1 nm to 20 nm bringing about a quantum effect, and the quantity of doped impurity is from $1E17/cm^3$ to $1E21/cm^3$. When ten to 50 layers of the quantum well layers 104 are formed, it is possible to realize a light emitting element excellent in linearity of the optical output responsive to injection of a current and free from saturation of the optical output from several mA to several A. In a light emitting element in which the GaP substrate 100 is bonded and shaped, the problem of re-absorption of light by the quantum well layer 104 as the absorption layer after being reflected from the crystal interface appears more prominently. However, absorption of light traveling across the well layer 104 can be reduced by thinning the well layer 104 as thin as 10 nm or less. Additionally, thinning the well layer 104 is effective for reducing the light-confining effect of the well layer 104 and for thereby diminishing the percentage of light existing in the well layer 104, and re-absorption in the well layer 104 is therefore reduced. As a result, light generated in the well layer 104 can be extracted effectively.

Next explained is the p-type InGaAlP barrier layer 105. The barrier layer 105 made of InGaAlP doped with Mg or Zn as p-type impurity and exhibiting p-type conductivity has a thickness from 1 nm to 20 nm, and the quantity of doped impurity is from $1E17/cm^3$ to $1E20/cm^3$. The barrier layer 105 has a band gap intermediate between that of the well layer 104 and that of the clad layer 102. This level of band gap is selected for the purpose of increasing the quantity of electrons and holes confined in the well layer 104 and the quantity of light exuding from the well layer 104. If an excessive quantity of impurity is doped into the barrier layer 105, absorption of light becomes prominent due to the level of the impurity. Therefore, the quantity of doped impurity is preferably limited not to exceed $5E19/cm^3$.

Next explained is the n-type InGaAlP clad layer 106. The clad layer 106 made of an InGaAlP material doped with Si or Se as n-type impurity and exhibiting n-type conductivity has a thickness from 0.1 µm to 2 µm, and the quantity of doped impurity is from $1E17/cm^3$ to $1E21/cm^3$. The clad layer 106 has a band gap wider than that of the active layer 104, and has the nature of confining electrons and holes in the active layer 104.

Next explained is the n-type InGaAlP current diffusion layer 107. The current diffusion layer made of an InGaAlP material doped with Si or Se as n-type impurity and exhibiting n-type conductivity has a thickness from 0.5 µm to 4 µm, and the quantity of doped impurity is from $1E17/cm^3$ to $1E21/cm^3$. The current diffusion layer 107 has a band gap narrower than that of the clad layer and not absorbing light from the active layer 104. Since the current diffusion layer 107 has a refractive index with a small difference from that of the well layer 104, it is effective for extracting light emitted toward the n-type clad layer 106 to the crystal surface. If the impurity is doped to a high concentration, they increase the percentage of lattice mismatch and hence degrade the crystalline property. Therefore, the quantity of doped impurity is preferably limited not to exceed $1E21/cm^3$ in case the thickness is equal to or less than 2 μm, and not to exceed $1E19/cm^3$ in case the thickness is from 2 μm to 4 μm.

Next explained is the n-type GaAs contact layer 108. The contact layer made of a GaAs material doped with Si or Se as n-type impurity and exhibiting n-type conductivity has a thickness from 1 nm to 100 nm, and the quantity of doped impurity is from $1E18/cm^3$ to $1E21/cm^3$. Since the material of the contact layer 108 absorbs light from the quantum well light emitting layer 104, its thickness is preferably limited equal to or less than tens of nanometer in which range influences of absorption are small. It is more preferable to use InGaP as the contact layer 108 because the percentage of absorbed light in the light from the quantum well layer 104 decreases.

Next explained is the p-side electrode 109. The p-side electrode 109 is made of a material containing Au or Zn, and when part of Zn diffuse into the contact layer, a favorable ohmic property appears. For the purpose of reinforcing the adhesiveness with the adhesive material, its thickness ranges from 1 μm to several μm.

Next explained is the n-type electrode 110. The n-type electrode 110 is made of a material containing Au and Ge, and may contain Mo in order to migration of the electrode. It is composed of bonding pad ranging from 1 μm to several μm in thickness, and a plurality of straight lines having thickness of several hundreds of nm and radially extending from the bonding pad. In a structure with the bonded GaP substrate 100, cracks were produced in the bonding interface due to the bonding weight and ultrasonic waves in the process of bonding Au wires. However, by controlling the thickness of the contact layer 108 from 0.1 μm to 0.5 μm and the thickness of the current diffusion layer 107 from 1 μm to 2 μm, it is possible to improve the device to be operative for a long period without cracking in the bonding process.

SECOND EMBODIMENT

Figure 9:
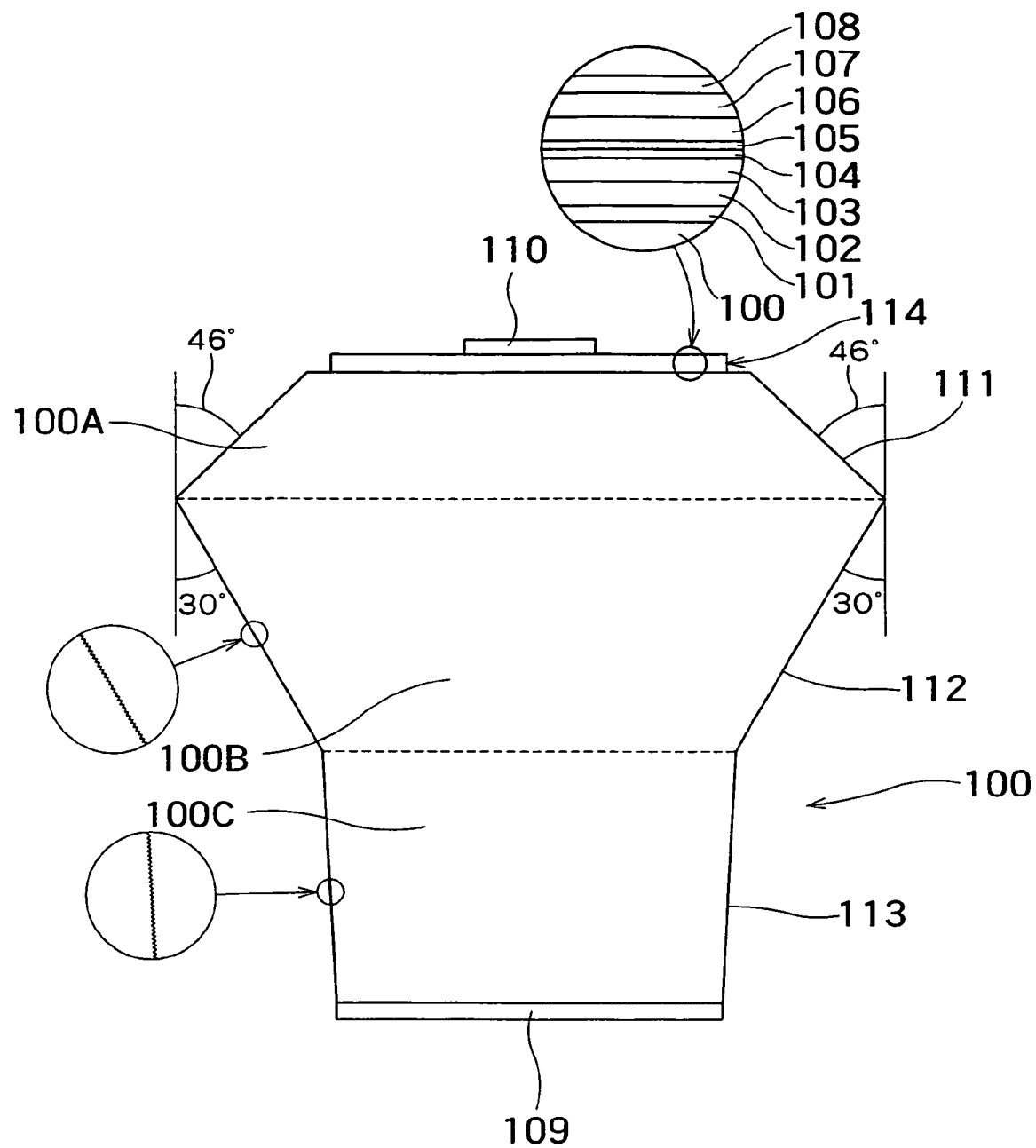
FIG. 9 is a schematic cross-sectional view showing a semiconductor light emitting element according to the second embodiment of the invention.

As shown in FIG. 9, a difference of the semiconductor light emitting element according to the second embodiment from the first embodiment (FIG. 1) lies in that the first side surfaces 111 of the substrate 100 incline to converge toward the top surface. This embodiment enhances the effect of preventing separation of the light emitting element 1 from the lead frame 2 (see FIG. 8) and the effect of increasing the light extracting efficiency. Although the emission output from the light emitting layer 114 slightly decreases as compared with the element according to the first embodiment (FIG. 1), the element shown here is nevertheless usable for some purposes different from those of the element according to the first embodiment.

FIG. 9 is a schematic cross-sectional view showing a semiconductor light emitting element according to the second embodiment of the invention. Some of the components identical to those of the first embodiment (FIG. 1) are labeled with common reference numerals. The angle of inclination of the first side surfaces 111 of the substrate 100 is 46°.

The first side surfaces 111 of the element shown in FIG. 9 are formed by dicing. That is, the first side surfaces 111 are not side surfaces obtained by cleavage along cleavable planes. The side surfaces 111 formed by dicing include damage regions. The damage regions, however, can be removed to a certain extent by etching using a hydrochloric acid series etchant.

In the element of FIG. 9, since the first side surfaces 111 are opposed to the second side surfaces 112, they can extract part of light reflected from the second side surfaces 112 to the exterior and can further increase the light extracting efficiency.

Since the element of FIG. 9 is so configured that the first side surfaces 111 converge toward the top surface, if the element 1 is mounted on the lead frame 2 as shown in FIG. 8, it will receive a downward force, as illustrated, from the resin 8. Therefore, this embodiment enhances the effect of preventing separation of the light emitting element 1 from the lead frame 2.

As such, the element of FIG. 9 is enhanced in the effect of preventing separation and the effect of increasing the light extracting efficiency more than the element of FIG. 1. However, since the element of FIG. 9 uses the first side surfaces 111 that are not made by cleavage, damage to the light emitting layer 114 slightly increases, and emission output from the light emitting layer 114 slightly decreases. Therefore, the element of FIG. 9 may be used for purposes different from those of the element of FIG. 1.

The angle of inclination of the first side surfaces 111 in the element of FIG. 9 can be determined as desired within the range from equal to or larger than 16° to equal to or smaller than 60° by adjusting the angle of the tip of the dicing blade. If the angle of inclination is smaller than 16°, then the effect of preventing separation is difficult to obtain. It is difficult to increase the angle of inclination over 60° from the viewpoint of the manufacturing process.

For the purpose of enhancing the light extracting efficiency, the angle of inclination of the first side surfaces 111 is preferably adjusted to ±16° from the angle of inclination of the second side surfaces 112. For example, in case the angle of inclination of the second side surfaces 112 is 30° as shown in FIG. 9, it is advantageous to adjust the angle of inclination of the first side surfaces 111 to 14° or 46° in order to enhance the light extracting efficiency. For the purpose of enhancing the effect of preventing separation, the preferable angle of inclination is 46°.

THIRD EMBODIMENT

Figure 10:
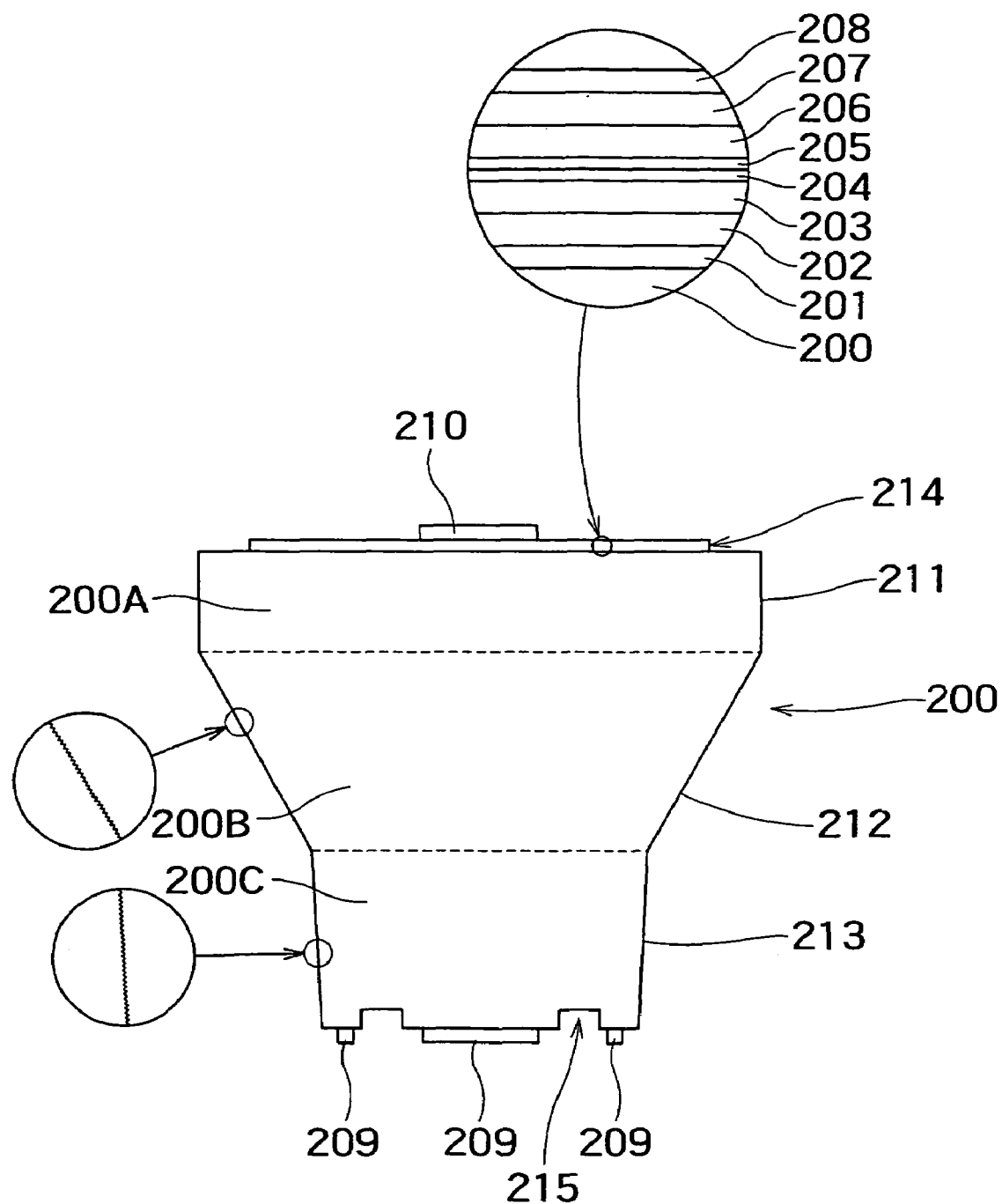
FIG. 10 is a schematic cross-sectional view showing a semiconductor light emitting element according to the third embodiment of the invention.

As shown in FIG. 10, a difference of the semiconductor light emitting element according to the third embodiment from the first embodiment (FIG. 1) lies in the first side surfaces 211 being approximately vertical to the top surface of the substrate 200 and grooves 215 formed in the bottom surface of the substrate 200. The first side surfaces 211 are formed by cleavage similarly to the first embodiment.

Figure 11:
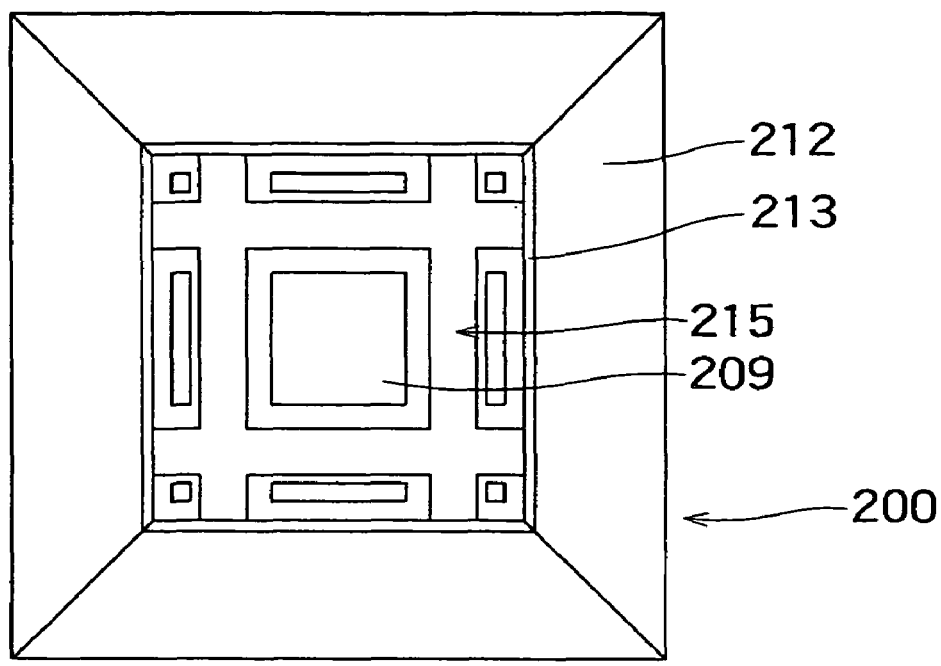
FIG. 11 is a bottom view of the semiconductor light emitting element according to the third embodiment.
Figure 16:
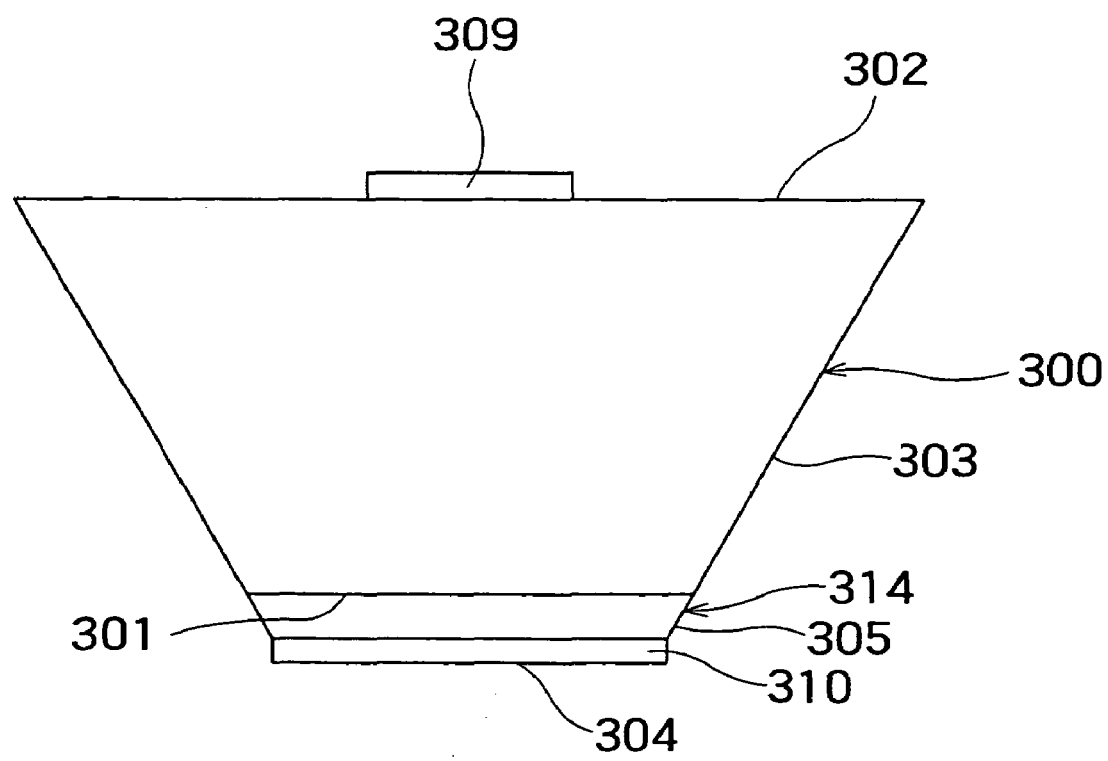
FIG. 16 is a schematic cross-sectional view of an existing semiconductor light emitting element.

FIG. 10 is a schematic cross-sectional view showing a semiconductor light emitting element according to the third embodiment of the invention. FIG. 11 is a bottom view of the element of FIG. 9 taken from the bottom of the substrate 200. Similarly to the first embodiment, the semiconductor light emitting element has a structure including a GaP substrate 200 and a light emitting layer 214 made of an InGaAlP compound material on the GaP substrate 200. Thickness of the light emitting layer 214 is several μm, and thickness of the GaP substrate is hundreds of μm. In the element of FIG. 10, the angle of inclination of the substrate 200 is 0°. Therefore, the first side surfaces 211 that are cleaved surfaces are substantially vertical to the bottom and top surfaces of the substrate 200.

Since the element of FIG. 10, explained above, the first side surfaces 211 can be formed by cleavage, and the cleaved surfaces are vertical to the top surface, the manufacturing process is simplified. Additionally, since the first side surfaces 211 are formed by cleavage, it is here again possible, similarly to the first embodiment, to prevent crystalline defects of the light emitting layer 214 and thereby enhance the optical output.

In the element of FIG. 10, however, since the first side surfaces 211 are vertical to the top surface, the force the resin 8 urges the first side surfaces 211 toward the lead frame 2 is weaker when the element 1 is mounted on the lead frame 2 (see FIG. 8). To cope with it, the element of FIG. 10 has grooves 215 in the bottom surface of the substrate 200. The grooves 215 increase the contact area of the bottom surface and the p-side electrode 209 with the mount agent 6 (see FIG. 8), and increase the adhesive force. As a result, separation of the light emitting element 1 is alleviated, and a sufficient lifetime is ensured. The p-side electrode 209 is formed to lie in the center of the bottom surface and to extend in form of lines along side portions of the bottom surface.

In the element shown in FIG. 10, the second side surfaces 212 and the third side surfaces 213 have a plurality of ups and downs that are 1~2 µm high along the surface. The ups and downs increase the surface area, and increase the adhesive force between the sealing resin 8 and the semiconductor light emitting element 1. From this point of view as well; separation of the light emitting element 1 is alleviated.

Although the semiconductor light emitting element shown in FIGS. 10 and 11 explained above include the grooves 215 formed in the bottom surface, if the device is used in environments unlikely to invite separation between the element 1 and the lead frame 2, the grooves 215 need not be formed.

Additionally, the semiconductor light emitting element shown in FIGS. 10 and 11, the first side surfaces may be formed to incline similarly to the second embodiment (FIG. 9), depending upon the purpose of its use.

FOURTH EMBODIMENT

Figure 12:
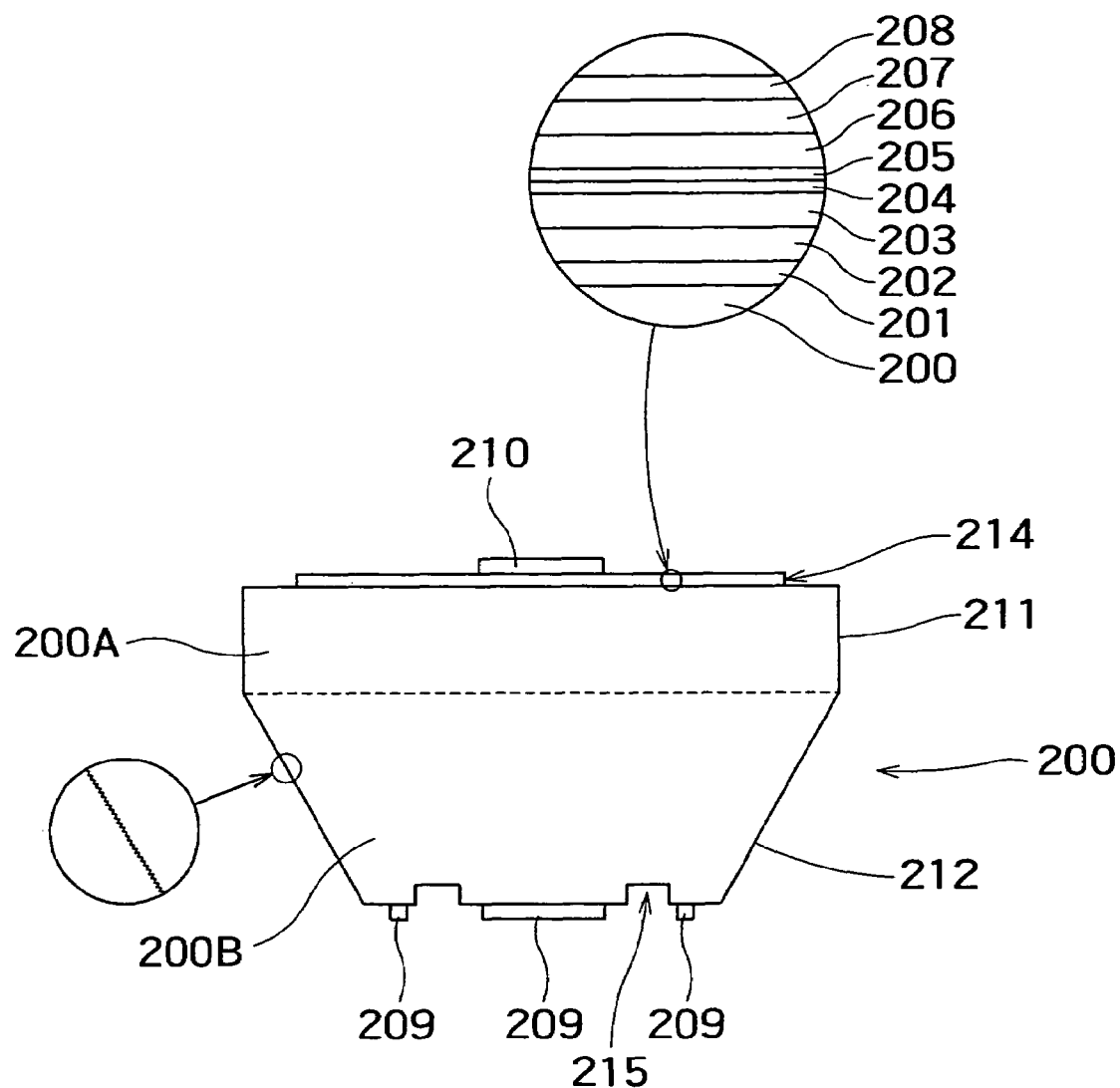
FIG. 12 is a schematic cross-sectional view showing a semiconductor light emitting element according to the fourth embodiment of the invention.

FIG. 12 is a view showing a semiconductor light emitting element according to the fourth embodiment of the invention. A difference thereof from the third embodiment (FIG. 10) lies in that the GaP substrate 200 does not have the third portion 200C. Some of components identical to those of the third embodiment (FIG. 10) are labeled with common reference numerals.

In the element of FIG. 12, the light emitting layer 214 for emitting light by current injection is formed on the top surface of the GaP substrate 200. The GaP substrate 200 includes the top surface on which the light emitting layer 214 is formed, a first portion 200A having the top surface, and a second portion 200B adjacent to the first portion 200A. The second portion 200B defines second side surfaces 212 inclining to diverge toward the first portion 200A and to extract part of light from the light emitting layer 214 to the exterior. The first portion 200A defines first side surfaces 211 obtained by cleavage along cleavable planes.

Figure 13:
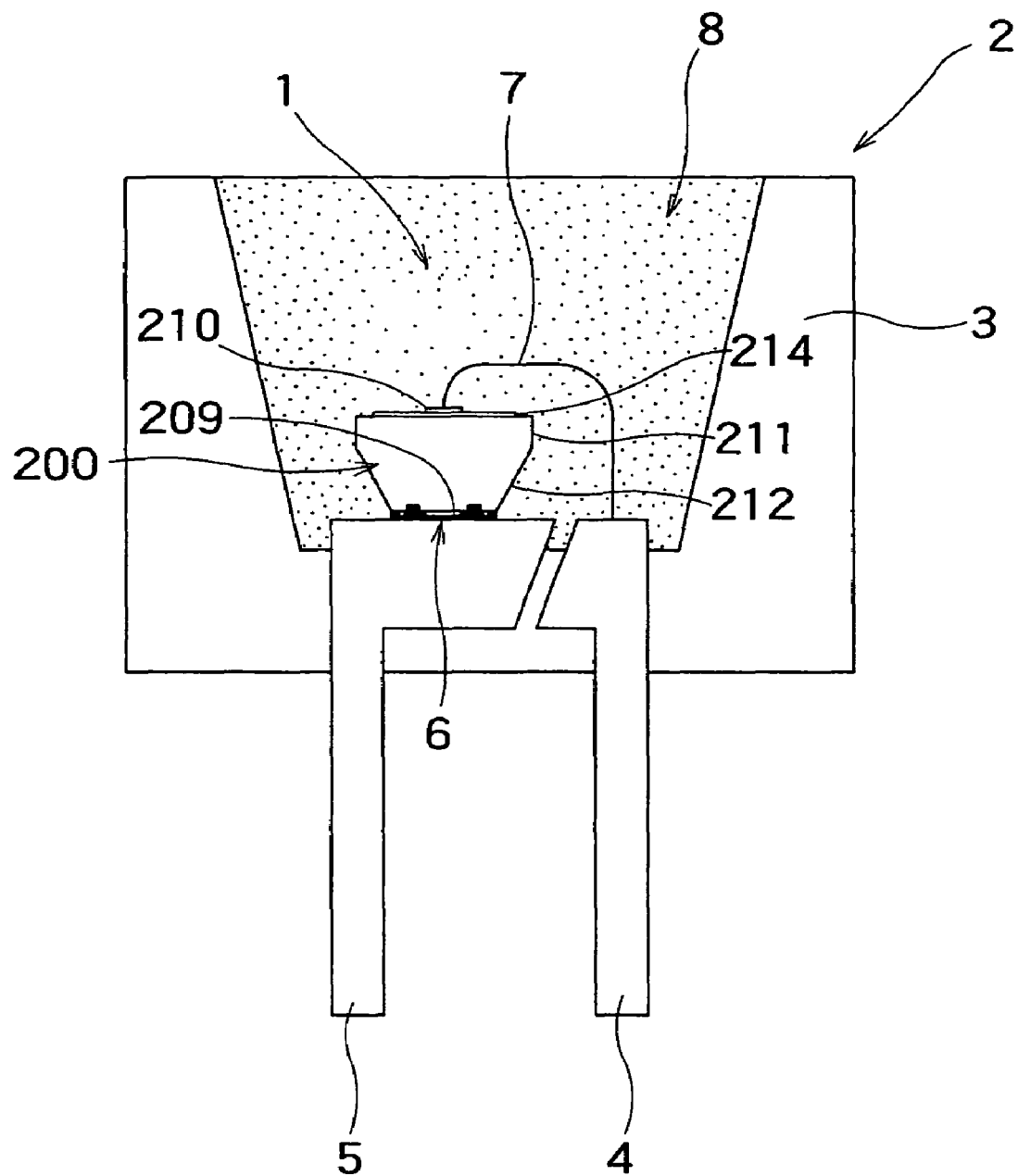
FIG. 13 is a schematic cross-sectional view showing a semiconductor light emitting device according to the fourth embodiment of the invention.

FIG. 13 is a view showing a semiconductor light emitting device obtained by mounting the element 1 of FIG. 12 on a lead frame 2. Its basic structure is identical to that of FIG. 8. Some of components identical to those of FIG. 8 are labeled with common reference numerals.

Also in the device of FIG. 13, since the light emitting element 1 has formed the second side surfaces 212, the light extracting efficiency is enhanced. Additionally, since the light emitting element 1 has formed the first side surfaces 211 made by cleavage, crystal defects are reduced. Therefore, this embodiment can realize a device enhanced in light extracting efficiency and emission output.

Additionally, the device of FIG. 13 not having the third side surfaces 213 on the light emitting element 1 simplifies its manufacturing method.

In the device of FIG. 13, however, since the third side surfaces 213 are not provided, the mount agent 6 tends to creep onto part of the second side surfaces 212, and may degrade the optical output. To cope with it, the device of FIG. 13 employs the following structure.

As the first countermeasure, in the device of FIG. 13, the second side surfaces 212 define a plurality of ups and downs that are 1~2 µm high. These ups and downs increase the surface area and increase the adhesive force between the sealing resin 8 and the semiconductor light emitting element 1. Therefore, the light emitting element is alleviated in possibility of separation from the lead frame 2, and this enables the use of a reduced quantity of mounting agent 6 to prevent creepage of the mount agent 6 onto the second side surfaces 212. Additionally, since the ups and downs increase the surface area, even if an excessive quantity of the mount agent 6 is applied, the mount agent 6 is more difficult to creep upward, as illustrated. Thus the instant embodiment can prevent the mounting agent 6 from undesirably spreading onto the second side surfaces.

As the second countermeasure, in the device of FIG. 13, the grooves are formed in the bottom surface of the substrate 200 as shown in FIG. 12. The grooves increase the contact area of the bottom surface and the p-side electrode 209 with the mount agent 6, and increase the adhesive force. This enables the use of a reduced quantity of mounting agent 6 to prevent creepage of the mount agent 6 onto the second side surfaces 212.

As such, the device of FIG. 13 simplifies the manufacturing process, and can prevent degradation of the optical output.

In the above-explained semiconductor light emitting element shown in FIGS. 12 and 13, the grooves are formed in the bottom surface of the substrate 200; however, the grooves 215 need not be formed if the device is used in environments unlikely to invite separation between the element 1 and the lead frame 2.

FIFTH EMBODIMENT

Figure 14:
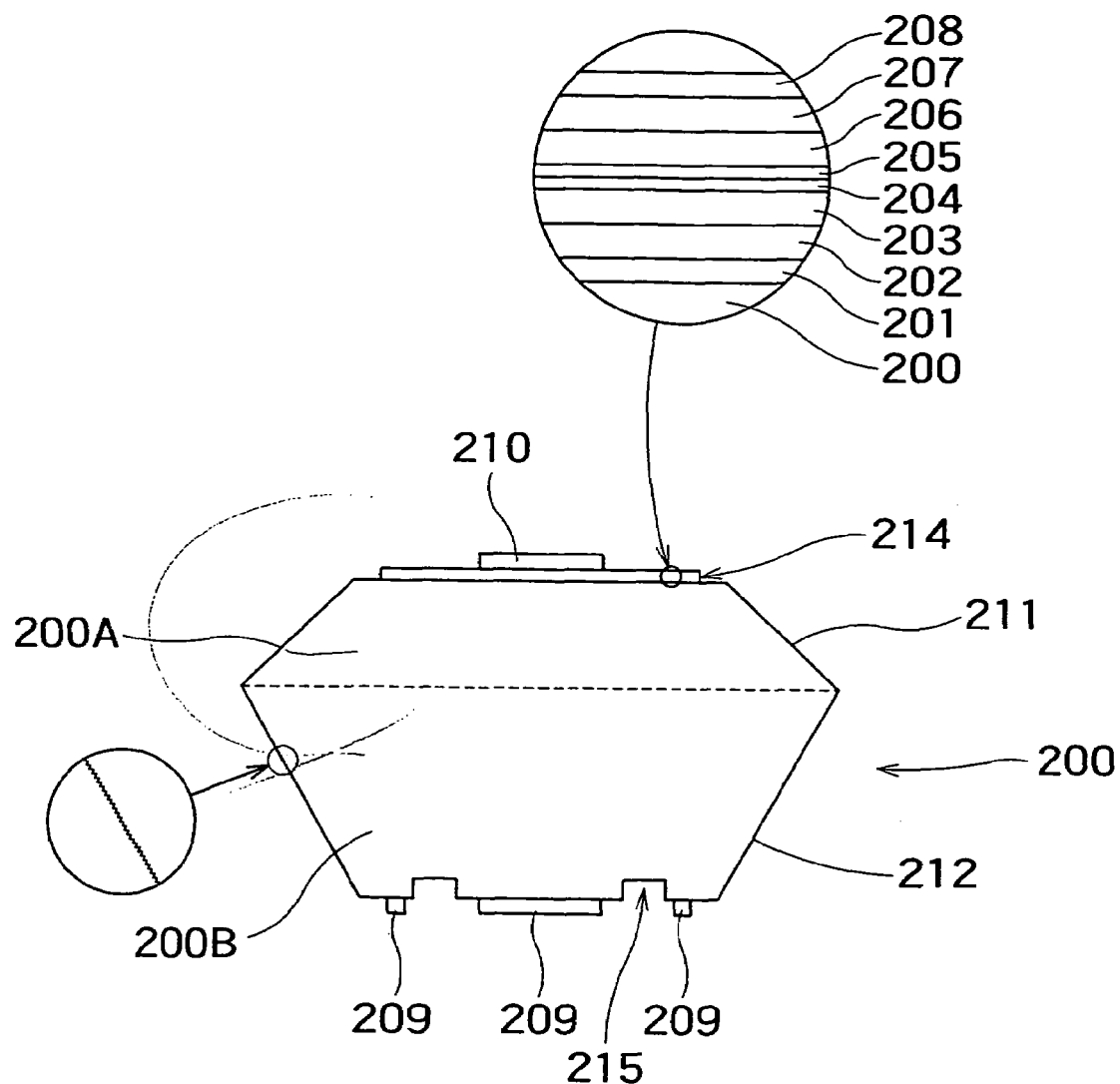
FIG. 14 is a schematic cross-sectional view showing a semiconductor light emitting element according to the fifth embodiment of the invention.

As shown in FIG. 14, a difference of the semiconductor light emitting element according to the fifth embodiment from the fourth embodiment (FIG. 12) lies in the first side surfaces 211 being confined to incline to converge toward the top surface. The angle of inclination of the first side surfaces 211 is 46° equally to the second embodiment (FIG. 9). Some of components identical to those of the fourth embodiment (FIG. 12) are labeled with common reference numerals.

Figure 15:
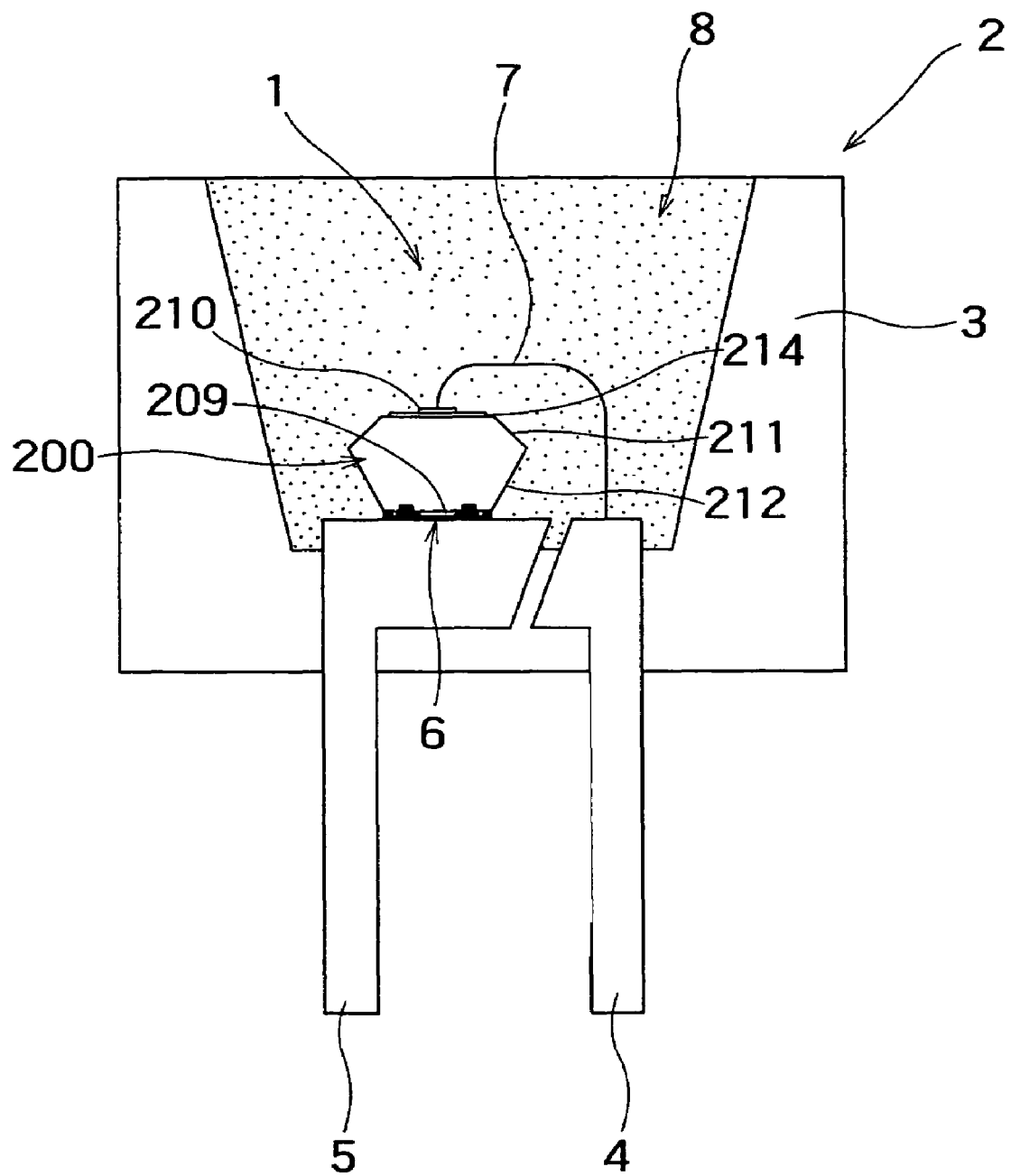
FIG. 15 is a schematic cross-sectional view showing a semiconductor light emitting device according to the fifth embodiment of the invention.

FIG. 15 is a view showing a semiconductor light emitting device obtained by mounting the element 1 of FIG. 14 on a lead frame 2. Its basic structure is identical to that of FIG. 13. Some of components identical to those of FIG. 13 are labeled with common reference numerals.

In the device shown in FIG. 15, since the first side surfaces 211 incline to converge toward the top surface, it is possible here again, similarly to the second embodiment, to enhance the effect of preventing separation of the light emitting element 1 from the lead frame 2 and the effect of increasing the light extracting efficiency more than the device of FIG. 13. Although the instant embodiment is slightly lower in optical output than the device according to the fourth embodiment (FIG. 13), it may be used for some purposes different from those of the device according to the fourth embodiment.

The device of FIG. 15 including the first side surfaces 211 inclining to converge toward the top surface to enhance the effect of preventing separation alleviates separation of the light emitting element 1 and can maintain a sufficient lifetime.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor light emitting element comprising:
a light emitting layer for emitting light; and
a substrate transparent to the light emitted from the light emitting layer, and having:
a top surface on which the light emitting layer is formed;
a bottom surface opposed to the top surface; and
side surfaces connecting the top surface and the bottom surface,
wherein each of the side surfaces is composed of first side surface extending from the top surface toward the bottom surface, second side surface extending from the first side surface toward the bottom surface, and third side surface extending from the second side surface toward the bottom surface,
wherein the third side surfaces incline to diverge toward the top surface, and the second side surfaces incline to diverge more toward the top surface to extract part of the light from the light emitting layer externally, and
wherein the first side surfaces incline to converge toward the top surface from the direction vertical to the top surface by an angle equal to or larger than 16° and equal to or smaller than 60°.

2. The semiconductor light emitting element according to claim 1 wherein the substrate is made of GaP.

3. The semiconductor light emitting element according to claim 1 wherein the light emitting layer includes InGaAlP layer.

4. The semiconductor light emitting element according to claim 1 wherein the angle of inclination of the second side surfaces of the substrate relative to the direction vertical to the top surface is equal to or larger than 20° and equal to or smaller than 40°.

5. The semiconductor light emitting element according to claim 2 wherein the second side surfaces and the third side surfaces define a plurality of depressions and protrusions having a height equal to or higher than 1 μm and equal to or lower than 2 μm.

6. The semiconductor light emitting element comprising:
a light emitting layer for emitting light; and
a substrate transparent to the light emitted from the light emitting layer, and having:
a top surface on which the light emitting layer is formed;
a bottom surface opposed to the top surface; and
side surfaces connecting the top surface and the bottom surface,
wherein each of the side surfaces is composed of first side surface extending from the top surface toward the bottom surface, second side surface extending from the first side surface toward the bottom surface, and third side surface extending from the second side surface toward the bottom surface,
wherein the third side surfaces incline to diverge toward the top surface, and the second side surfaces incline to diverge more toward the top surface to extract part of the light from the light emitting layer externally,
wherein the first side surfaces incline to converge toward the top surface from the direction vertical to the top surface by an angle equal to or larger than 16° and equal to or smaller than 60°, and
wherein grooves are formed in the bottom surface of the substrate.

7. The semiconductor light emitting element according to claim 6 wherein the second side surfaces define a plurality of depressions and protrusions having a height equal to or higher than 1 μm and equal to or lower than 2 μm.

8. The semiconductor Light emitting element according to claim 6 wherein the second side surfaces and the third side surfaces define a plurality of depressions and protrusions having a height equal to or higher than 1 μm and equal to or lower than 2 μm.

9. The semiconductor light emitting element according to claim 7 wherein the substrate is made of GaP.

10. The semiconductor light emitting element according to claim 7 wherein the light emitting layer includes InGaAlP layer.

11. The semiconductor light emitting element according to claim 7 wherein the angle of inclination of the second side surfaces of the substrate relative to the direction vertical to the top surface is equal to or larger than 20° and equal to or smaller than 40°.

12. The semiconductor light emitting element according to claim 8 wherein the substrate is made of GaP.

13. The semiconductor light emitting element according to claim 8 wherein the light emitting layer includes InGaAlP layer.

14. The semiconductor light emitting element according to claim 8 wherein the angle of inclination of the second side surfaces of the substrate relative to the direction vertical to the top surface is equal to or larger than 20° and equal to or smaller than 40°.

15. The semiconductor light emitting element according to claim 6 wherein an electrode is formed on a first area of the bottom surface of the substrate other than a second area where the grooves are formed.

16. The semiconductor light emitting element according to claim 7 wherein an electrode is formed on a first area of the bottom surface of the substrate other than a second area where the grooves are formed.

17. The semiconductor light emitting device, comprising:
a lead frame; and
a semiconductor light emitting element mounted on the lead frame, said semiconductor light emitting element comprising:
a light emitting layer for emitting light; and
a substrate transparent to the light emitted from the light emitting layer, and having:
a top surface on which the light emitting layer is formed;
a bottom surface opposed to the top surface; and
side surfaces connecting the top surface and the bottom surface, wherein each of the side surfaces is composed of a first side surface extending from the top surface toward the bottom surface, a second side surface extending from the first side surface toward the bottom surface, and a third side surface extending from the second side surface toward the bottom surface, wherein the third side surfaces incline to diverge toward the top surface, and the second side surfaces incline to diverge more toward the top surface to extract part of the light from the light emitting layer externally, wherein the first side surfaces incline to converge toward the top surface from the direction vertical to the top surface by an angle equal to or larger than 16° and equal to or smaller than 60°, and wherein grooves are formed in the bottom surface of the substrate.

18. The semiconductor light emitting device according to claim 17 wherein an electrode is formed on a first area of the bottom surface of the substrate other than a second area thereof where the grooves are formed.

19. The semiconductor light emitting device according to claim 17 wherein the second side surfaces define a plurality of depressions and protrusions.

20. The semiconductor light emitting device according to claim 17 wherein the second side surfaces and the third side surfaces define a plurality of depressions and protrusions.

21. The semiconductor light emitting device according to claim 17 wherein said lead frame comprises a first lead frame portion to be connected to one of power supply voltages and a second lead frame portion to be connected to the other of the power supply voltages, said semiconductor light emitting element further comprises a first and second electrodes, the first electrode being formed on the bottom surface of the substrate and the second electrode being formed on the light emitting layer, the first electrode is connected to the first lead frame portion of the lead frame and the second electrode is connected to the second lead frame portion of the lead frame via an Au wire.

* * * * *